(12) United States Patent
Polomoff et al.

(10) Patent No.: US 11,145,606 B1
(45) Date of Patent: Oct. 12, 2021

(54) CORNER STRUCTURES FOR AN OPTICAL FIBER GROOVE

(71) Applicant: GLOBALFOUNDRIES U.S. Inc., Santa Clara, CA (US)

(72) Inventors: Nicholas A. Polomoff, Hopewell Junction, NY (US); Jae Kyu Cho, Niskayuna, NY (US); Mohamed A. Rabie, Clifton Park, NY (US); Andreas D. Stricker, Essex Junction, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/830,543

(22) Filed: Mar. 26, 2020

(51) Int. Cl.
| H01L 23/00 | (2006.01) |
| H01L 23/522 | (2006.01) |
| H01L 31/02 | (2006.01) |
| H01L 33/62 | (2010.01) |

(52) U.S. Cl.
CPC ........ *H01L 23/562* (2013.01); *H01L 23/5226* (2013.01); *H01L 31/02005* (2013.01); *H01L 33/62* (2013.01)

(58) Field of Classification Search
None
See application file for complete search history.

(56) References Cited

U.S. PATENT DOCUMENTS

| 5,572,067 | A | 11/1996 | Thalapaneni |
| 5,633,968 | A | 5/1997 | Sheem |
| 5,846,874 | A | 12/1998 | Hartranft et al. |
| 5,887,089 | A | * 3/1999 | Deacon .................. G02F 1/035 385/22 |
| 6,163,065 | A | 12/2000 | Seshan et al. |
| 6,876,062 | B2 | 4/2005 | Lee et al. |
| 7,197,224 | B2 | 3/2007 | Rolston et al. |
| 7,202,550 | B2 | 4/2007 | Fu et al. |
| 8,125,054 | B2 | 2/2012 | West et al. |
| 8,217,394 | B2 | 7/2012 | Yang et al. |
| 9,279,943 | B1 | 3/2016 | McColloch |
| 9,728,474 | B1 | 8/2017 | Yi et al. |
| 9,798,088 | B2 | 10/2017 | Gambino et al. |
| 10,488,595 | B2 | 11/2019 | Grehn et al. |
| 2006/0239612 | A1 | 10/2006 | De Dobbelaere et al. |
| 2010/0078769 | A1 | 4/2010 | West et al. |
| 2012/0025209 | A1 | 2/2012 | Kim et al. |
| 2012/0207426 | A1 | 8/2012 | Doany et al. |
| 2013/0099391 | A1 | 4/2013 | Lamorey et al. |
| 2013/0209026 | A1 | 8/2013 | Doany et al. |

(Continued)

*Primary Examiner* — Bo B Jang
(74) *Attorney, Agent, or Firm* — Thompson Hine LLP; Anthony Canale (57) ABSTRACT

Structures for an optical fiber groove and methods of forming a structure for an optical fiber groove. A photonics chip includes a substrate and an interconnect structure over the substrate. The photonics chip has a first exterior corner, a second exterior corner, and a side edge extending from the first exterior corner to the second exterior corner. The substrate includes a groove positioned along the side edge between the first exterior corner and the second exterior corner. The groove is arranged to intersect the side edge at a groove corner, and the interconnect structure includes metal structures adjacent to the first groove corner. The metal structures extend diagonally in the interconnect structure relative to the side edge of the photonics chip.

16 Claims, 6 Drawing Sheets

(56) References Cited

U.S. PATENT DOCUMENTS

| | | | |
|---|---|---|---|
| 2014/0029894 A1* | 1/2014 | Bowen | G02B 6/4214 385/37 |
| 2014/0203175 A1 | 7/2014 | Kobrinsky et al. | |
| 2014/0321804 A1 | 10/2014 | Thacker et al. | |
| 2017/0059785 A1 | 3/2017 | Smith et al. | |

\* cited by examiner

CORNER STRUCTURES FOR AN OPTICAL FIBER GROOVE

BACKGROUND

The present invention relates to photonics chips and, more specifically, to structures for an optical fiber groove and methods of forming a structure for an optical fiber groove.

Photonics chips are used in many applications and systems such as data communication systems and data computation systems. A photonics chip integrates optical components, such as waveguide cores, polarizers, and optical couplers, and electronic components, such as field-effect transistors, into a unified platform. Among other factors, layout area, cost, and operational overhead may be reduced by the integration of both types of components into the unified platform.

Edge couplers are commonly used in photonics chips for coupling optical signals between optical fibers and waveguides on the photonics chip. In general, an edge coupler is arranged adjacent to a groove defined in the photonics chip and an optical fiber is placed in the groove. Optical signals from the much larger core of the optical fiber may be transferred by the edge coupler to a considerably smaller waveguide on the photonics chip. Measures are taken to house and attach the tip of the optical fiber within the groove to the photonics chip.

The groove has a construction and geometry that may introduce high stress and strain regions in the photonics chip proximate to the groove corners. During use, the photonics chip may be subjected to additional stresses arising from heating and differential thermal expansion relative to package components to which they are attached, as well as the potential for stresses from mechanical vibrations if the photonics chip is attached to a moving object. Due to these stresses and related strains, cracks can propagate inward from the groove corners and eventually reach and damage optical and electronic components in an active portion of the photonics chip.

Improved structures for an optical fiber groove and methods of forming a structure for an optical fiber groove are needed.

SUMMARY

In an embodiment of the invention, a structure includes a photonics chip having a substrate and an interconnect structure over the substrate. The photonics chip has a first exterior corner, a second exterior corner, and a side edge extending from the first exterior corner to the second exterior corner. The substrate includes a groove positioned along the side edge between the first exterior corner and the second exterior corner. The groove is arranged to intersect the side edge at a groove corner, and the interconnect structure includes a plurality of metal structures adjacent to the first groove corner. The plurality of metal structures extend diagonally in the interconnect structure relative to the side edge.

In an embodiment of the invention, a method of forming a structure for a photonics chip is provided. The method includes forming a groove in a substrate that is positioned along a side edge of the photonics chip between a first exterior corner and a second exterior corner and that intersects the side edge at a groove corner, and forming an interconnect structure over the substrate that includes a plurality of metal structures that are positioned adjacent to the groove corner and that extend in the interconnect structure diagonally relative to the side edge.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
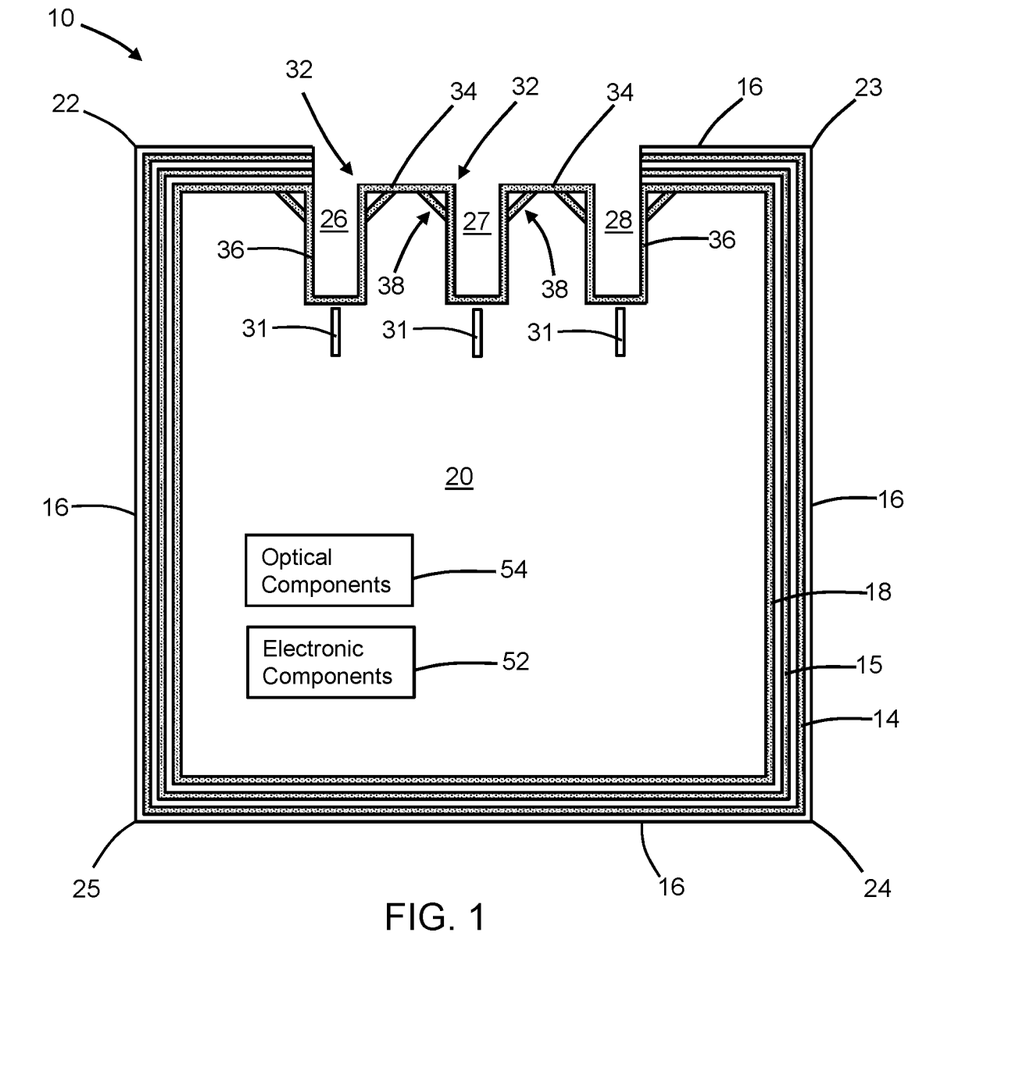
FIG. 1 is a top view of a photonics chip including a structure for an optical fiber groove in accordance with embodiments of the invention.
Figure 2:
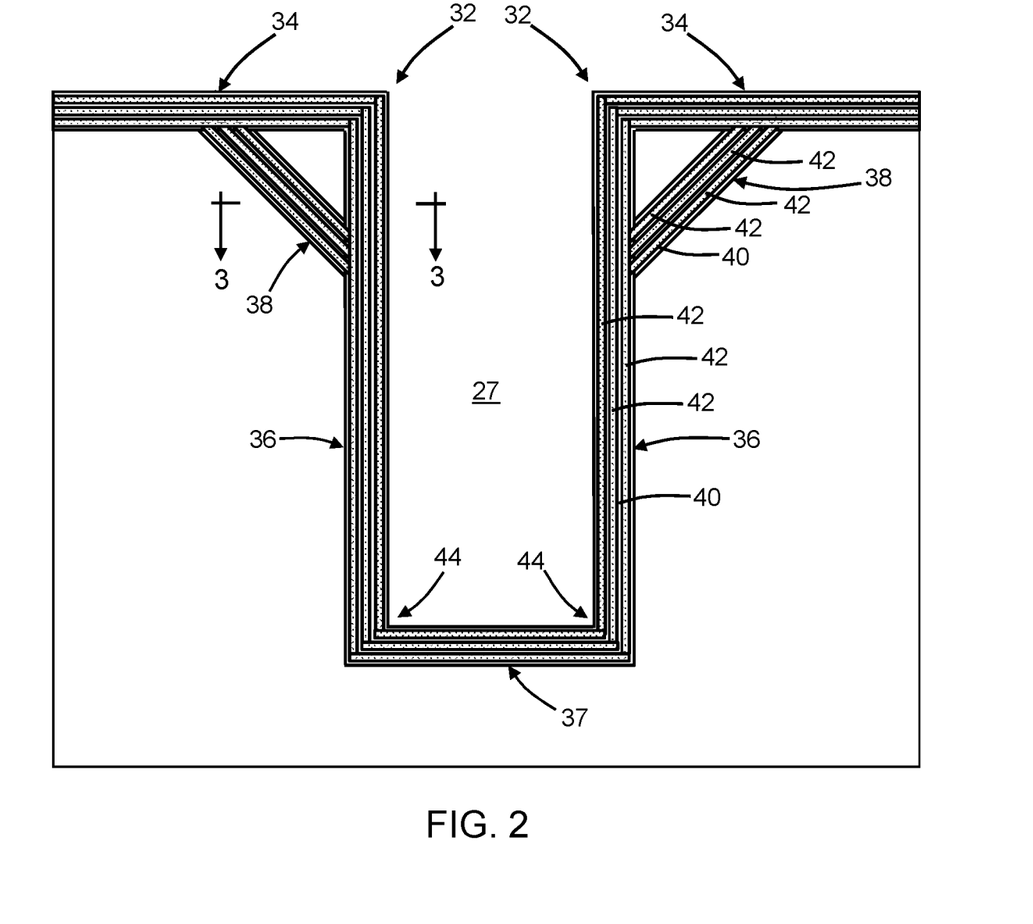
FIG. 2 is an enlarged view of a portion of FIG. 1.
Figure 3:
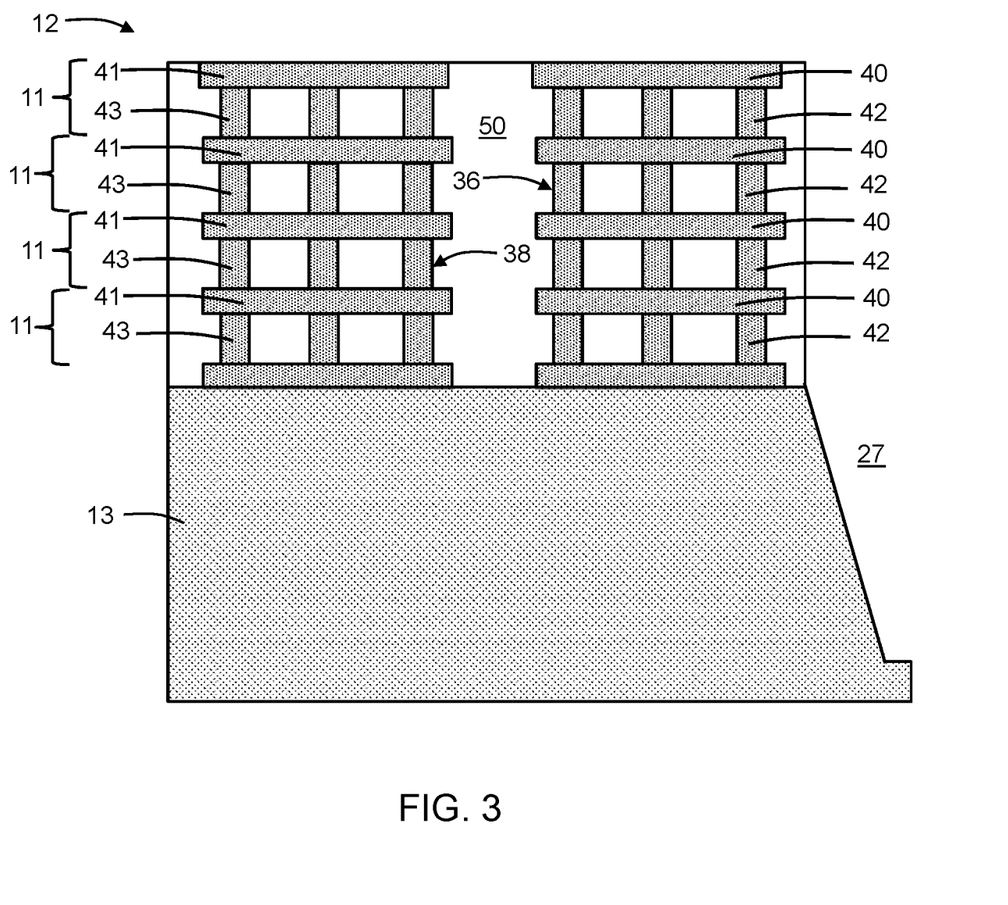
FIG. 3 is a cross-sectional view taken generally along line 3-3 in FIG. 2.

With reference to FIGS. 1-3 and in accordance with embodiments of the invention, a photonics chip 10 includes a substrate 13 and an interconnect structure 12 that is formed by middle-of-line and back-end-of-line processing over a substrate 13. The interconnect structure 12, which includes multiple metallization levels 11, may be coupled with electronic components 52 and optical components 54 that are integrated into the photonics chip 10. The electronic components 52 of the photonics chip 10 may include field-effect transistors that are fabricated by front-end-of-line processing. The metallization levels 11 of the interconnect structure 12 includes interlayer dielectric layers 50 composed of a dielectric material, such as silicon dioxide.

The photonics chip 10 includes peripheral side edges 16 and exterior corners 22, 23, 24, 25 that are generally defined at the intersections of the side edges 16. The interconnect structure 12 includes crackstop rails 14, 15 that extend in directions within a plane parallel to and adjacent to the side edges 16 at the perimeter of the photonics chip 10. The interconnect structure 12 further includes a guard ring 18 that is disposed inward from the crackstop rails 14, 15. The guard ring 18 also extends in directions within a plane parallel to and adjacent to the side edges 16 at the perimeter of the photonics chip 10. The crackstop rails 14, 15 and guard ring 18 may be composed of a metal, such as copper and/or aluminum, with additional liner and barrier layers (e.g., tantalum nitride and/or tantalum, or titanium nitride and/or titanium) also present as cladding, and are formed in the interlayer dielectric layers 50 of the metallization levels 11 of interconnect structure 12.

An active portion 20 of the photonics chip 10 is disposed inward from the crackstop rails 14, 15 and guard ring 18. The active portion 20 includes the electronic components 52 and optical components 54 of the photonics chip 10 and portions of the interconnect structure 12 that are coupled to the electronic components 52 and optical components 54.

The crackstop rails 14, 15 and the guard ring 18 are positioned in a lateral direction between the active portion 20 of the photonics chip 10 and the side edges 16 of the photonics chip 10. In addition, the guard ring 18 is positioned in a lateral direction between the active portion 20 of the photonics chip 10 and the crackstop rails 14, 15.

The crackstop rails 14, 15 and the guard ring 18 experience a directional change at each of the exterior corners 22, 23, 24, 25 and, in an embodiment, the directional change may be provided in each instance at a right angle (i.e., a 90° included angle) arising from perpendicular intersections.

Grooves 26, 27, 28 are formed in the photonics chip 10. A lower portion of each of the grooves 26, 27, 28 is formed in the substrate 13 by lithography and etching processes. An upper portion of each of the grooves 26, 27, 28 extends through the interconnect structure 12 above the corresponding lower portion that is etched in the substrate 13. A tip of an optical fiber may be inserted and supported at least in part by the lower portion of each of the grooves 26, 27, 28. The tip of the optical fiber (not shown) in each of the grooves 26, 27, 28 may be aligned with an edge coupler 31 on the photonics chip 10. The edge coupler 31 connects the optical fiber with a waveguide on the photonics chip 10. A polymer lid (not shown) may be applied over the grooves 26, 27, 28 after the optical fiber tips are inserted.

The lower portion of each of the grooves 26, 27, 28 is shaped to provide secure positioning and support. In the representative embodiment, the lower portion of each of the grooves 26, 27, 28 in the substrate 13 may have a V-shape with tapered sidewalls that contact the inserted tip of the optical fiber. The lower portion of each of the grooves 26, 27, 28 may have a shape of a different geometry, such as a U-shape, engineered through the selection of specific etching processes during their formation.

The grooves 26, 27, 28 are positioned as a set or group along the side edge 16 of the photonics chip 10 between the exterior corner 22 and the exterior corner 23. The group of grooves 26, 27, 28 is spaced along the side edge 16 from the exterior corner 22 and is spaced along the side edge 16 from the exterior corner 23. Consequently, the grooves 26, 27, 28 do not coincide or overlap with either of the exterior corners 22, 23 of the photonics chip 10. An intact portion of the interconnect structure 12 and an unetched portion of the substrate 13 may be located between the group of grooves 26, 27, 28 and the exterior corner 22. Another intact portion of the interconnect structure 12 and another unetched portion of the substrate 13 may be located between the group of grooves 26, 27, 28 and the exterior corner 23. The crackstop rails 14, 15 in the interconnect structure 12 may be discontinuous along the side edge 16 over the space between the groove 26 and the groove 28.

The grooves 26, 27, 28 define a corner 32 at each location at which a groove sidewall intersects the side edge 16. The guard ring 18 includes segments 34 that extend parallel to and adjacent to the side edge 16 between the corners 32, as well as segments 34 between the corners 32 and the exterior corners 22, 23. The guard ring 18 also includes segments 36, 37 that extend about the perimeter of each of the grooves 26, 27, 28. The segments 36 of the guard ring 18 extend transverse to the side edge 16 and are located at opposite side edges of the grooves 26, 27, 28. The segments 37 of the guard ring 18 extend parallel to the side edge 16 and are located at the interior end of the grooves 26, 27, 28. The segments 34 intersect the segments 36 to provide a directional change at each of the corners 32 and, in an embodiment, the directional change in each instance is a right angle due to perpendicular segment intersections. The segments 36 connect each segment 37 with the segments 34 such that the guard ring 18 is continuous and unbroken along the side edge 16 between the exterior corner 22 and the exterior corner 23.

The grooves 26, 27, 28 further include corners 44 that are spaced inward from the corners 32 at the side edge 16 and inside the photonics chip 10 from the side edge 16. The segments 36 and segment 37 associated with each of the grooves 26, 27, 28 intersect to provide a directional change at each of the corners 44. In an embodiment, the directional change at each corner 44 may be an included right angle of 270°. The corners 44 represent inside corners that may have an included angle of 270° in contrast to the outside corners 32 that may have an included angle of 90°.

The number of grooves 26, 27, 28 in the groove set along the side edge 16 between the exterior corners 22, 23 may vary from the representative number. In an alternative embodiment, the grooves 26, 27, 28 may be merged into a single groove. In an embodiment, an additional set of grooves similar to the set of grooves 26, 27, 28 may be provided in the photonics chip 10 along another of the side edges 16. For example, an additional set of grooves may be provided along the side edge 16 between the exterior corner 24 and the exterior corner 25.

A reinforcement structure 38 is arranged proximate to each of the corners 32. Each reinforcement structure 38 extends diagonally relative to the side edge 16 between an intersection with one of the segments 34 of the guard ring 18 and an intersection with one of the segments 36 of the guard ring 18. Each reinforcement structure 38 is oriented at an angle relative to the intersected segments 34, 36 and relative to the side edge 16 between the exterior corners 22, 23. In an embodiment, each reinforcement structure 38 may intersect one of the segments 34 (and be angled relative to the side edge 16) at an acute angle (e.g., 45°) and may also intersect one of the segments 36 (and be angled relative to the side edge 16) at an acute angle (e.g., 45°).

The guard ring 18, including the segments 34, 36, includes plates 40 and vias 42 as metal structures that are positioned in the interlayer dielectric layers 50 of the different metallization levels 11 of the interconnect structure 12. Each adjacent pair of the plates 40 is connected by vias 42 that extend in a in a vertical direction between an overlying plate 40 and an underlying plate 40. The space around the plates 40 and the vias 42 may be filled by dielectric material from the interlayer dielectric layers 50 of the interconnect structure 12. The plates 40 and vias 42 of the guard ring 18 collectively define a stack of interconnected structures within the interconnect structure 12 and provide a stacked conductive element that extends peripherally about the side edges 16 of the photonics chip 10.

In a representative embodiment, the vias 42 may be elongate bar vias that are linear shapes with smooth sidewalls and that extend parallel or substantially parallel to each other. In alternative embodiments, the vias 42 may be formed with a non-linear shape, such as an angular shape characterized by sidewalls having sharp turns in alternating directions (i.e., a zigzag pattern) or a more complex shape, such as a fishnet shape, that increases the metal density. The plates 40 and vias 42 exhibit the same changes in direction at the corners 32, 44 as the segments 34, 36, 37.

Each reinforcement structure 38 includes plates 41 and vias 43 as metal structures that are positioned in each of the metallization levels of the interconnect structure 12. The plates 41 and vias 43 are substantially similar in construction to the plates 40 and vias 42 of the guard ring 18 with the exception of angular orientation. The plates 41 of each reinforcement structure 38 intersect and directly connect to the plates 40 of the segments 34, 36 in each of the metallization levels. The vias 43 of each reinforcement structure 38 intersect and are directly connect to the nearest-neighbor via 42 of the segment 34 and the nearest-neighbor via 42 of the segment 36 in each of the metallization levels. In an embodiment, the angles of intersection (and angles of inclination relative to the side edge 16) are acute angles (e.g., 45°). The plates 41 and vias 43 of each reinforcement structure 38 extend diagonally relative to the side edge 16 between the plates 40 and vias 42 of one of the segments 34 of the guard ring 18 and the plates 40 and vias 42 of one of the segments 36 of the guard ring 18.

The reinforcement structures 38 provide reinforced mechanical support and stress relief proximate to each of the corners 32. The reinforcement structures 38 function to alleviate high stress and strain regions that may occur proximate to the corners 32 and, thereby, function to reduce the risk and occurrence of delamination, cracks, or other chip failure modes or mechanisms following packaging of the photonics chip 10. The reinforcement structures 38 may also provide a barrier to prevent moisture ingress into the active portion 20 of the photonics chip 10, and may define an exclusion zone for electronic components 52 and optical components 54.

Figure 4:
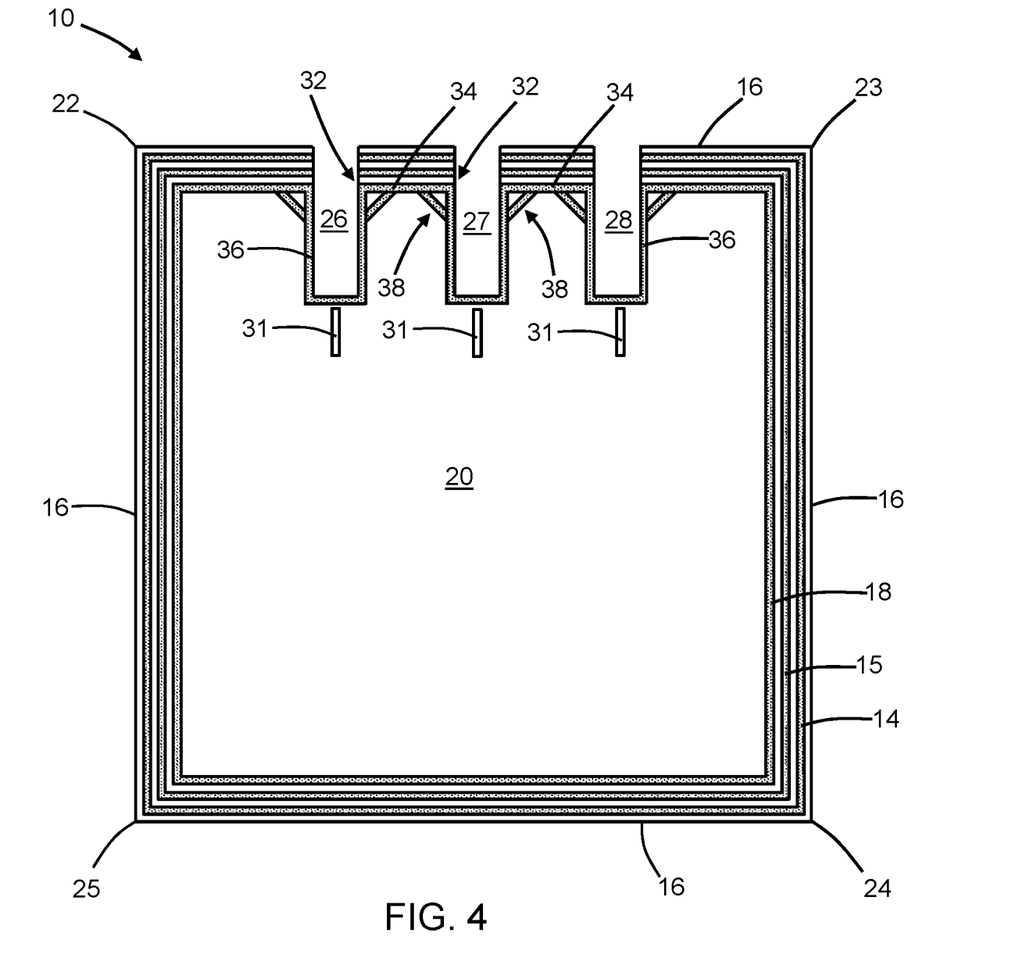
FIG. 4 is a top view of a photonics chip including a structure for an optical fiber groove in accordance with alternative embodiments of the invention.

With reference to FIG. 4 and in accordance with alternative embodiments of the invention, the grooves 26, 27, 28 may extend through the crackstop rails 14, 15 along the side edge 16 between exterior corners 22, 23 such that sections of the crackstop rails 14, 15 are arranged along the side edge 16 between grooves 26 and 27 and between grooves 27 and 28.

Figure 5:
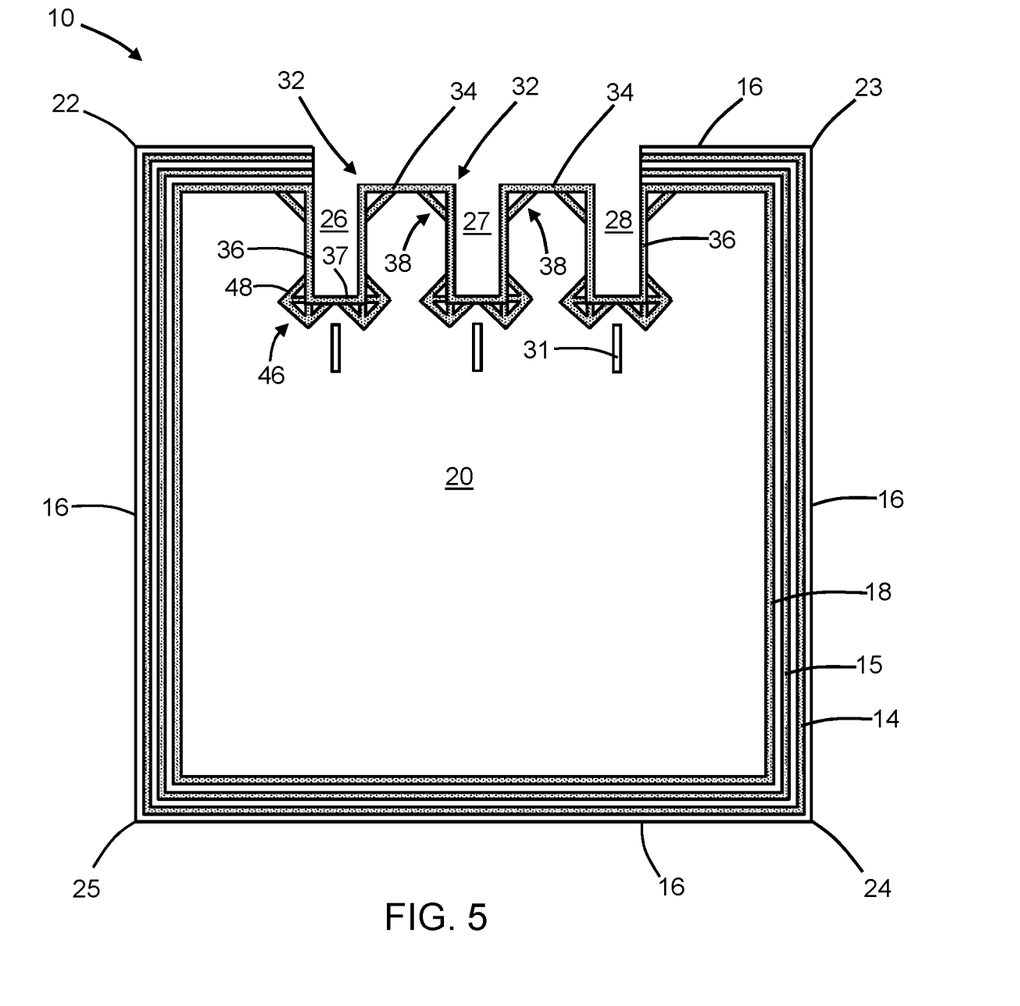
FIG. 5 is a top view of a photonics chip including a structure for an optical fiber groove in accordance with alternative embodiments of the invention.

With reference to FIG. 5 and in accordance with alternative embodiments of the invention, multiple bracket segments 48 may be arranged in respective groups 46 at the corners 44 of the grooves 26, 27, 28. The bracket segments 48 are similar in construction to the reinforcement structures 38 and, in that regard, each bracket segment 48 includes plates 41 and vias 43 that are stacked within the interconnect structure 12. The bracket segments 48 in each group 46 surround one of the corners 44 and each of the bracket segments 48 is angled relative to the segment 36 or the segment 37 at a particular corner 44. For example, bracket segments 48 may be angled at an acute angle (e.g., 45°) relative to each other, one of the bracket segments 48 may intersect the segment 36 extending to each corner 44 and may be angled at an acute angle (e.g., 45°) relative to the segment 36, and one of the bracket segments 48 may intersect the segment 37 extending to each corner 44 and may be angled at an acute angle (e.g., 45°) relative to the segment 37. At each corner 44, a short extension segment may extend from the segment 36 to a vertex of the bracket segments 48, and another short extension segment may extend from the segment 37 to another vertex of the bracket segments 48.

In an alternative embodiment, the bracket segments 48 may be used in combination with the reinforcement structures 38.

Figure 6:
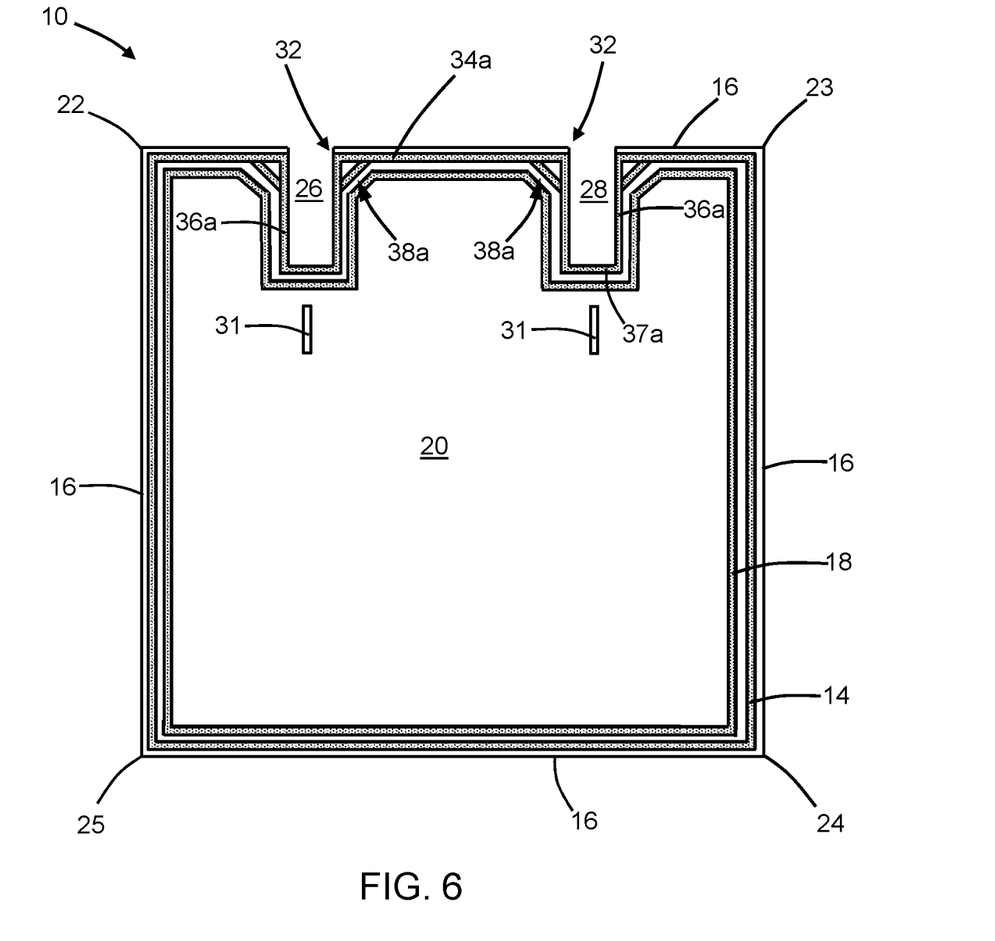
FIG. 6 is a top view of a photonics chip including a structure for an optical fiber groove in accordance with alternative embodiments of the invention.

With reference to FIG. 6 and in accordance with alternative embodiments of the invention, a reinforcement structure 38a may be included in the crackstop rail 14 adjacent to the corners 32 defined by the grooves 26, 28, instead of the reinforcement structure 38 in the guard ring 18. The crackstop rail 14 may include segments 34a, 36a, 37a similar to the segments 34, 36, 37 of the guard ring 18. The reinforcement structure 38a and segments 34a, 36a, 37a of the crackstop rail 14 include plates (not shown) and vias (not shown) similar to the plates 40 and vias 42 of the reinforcement structure 38 and segments 34, 36, 37 of the guard ring 18. The guard ring 18, as well as any other crackstop rail positioned between the crackstop rail 14 and the guard ring 18, may have a chamfered corner adjacent to the reinforcement structure 38a.

In an alternative embodiment, the bracket segments 48 associated with the guard ring 18 may be used in combination with the reinforcement structures 38a.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a photonics chip including a substrate and an interconnect structure over the substrate, the photonics chip having a first exterior corner, a second exterior corner, and a side edge extending from the first exterior corner to the second exterior corner, the substrate including a groove positioned along the side edge between the first exterior corner and the second exterior corner, the groove arranged to intersect the side edge at a first groove corner, the interconnect structure including a first plurality of metal structures adjacent to the first groove corner, and the first plurality of metal structures extending diagonally in the interconnect structure relative to the side edge, wherein the interconnect structure includes a plurality of metallization levels, the first plurality of metal structures include a plurality of plates and a plurality of vias positioned in the plurality of metallization levels, and the plurality of vias connect the plurality of plates.

2. The structure of claim 1 wherein the interconnect structure includes a crackstop rail, and the first plurality of metal structures are arranged at the first groove corner adjacent to the crackstop rail.

3. The structure of claim 1 wherein the plurality of vias comprise a plurality of bar vias.

4. The structure of claim 3 wherein the plurality of bar vias in each metallization level are aligned substantially parallel to each other.

5. The structure of claim 1 wherein the interconnect structure includes a guard ring, and the first plurality of metal structures are arranged at the first groove corner adjacent to the guard ring.

6. The structure of claim 1 wherein the groove includes a second groove corner spaced inside the photonics chip from the side edge, the interconnect structure including a second plurality of metal structures adjacent to the second groove corner, and the second plurality of metal structures are arranged about the second groove corner.

7. The structure of claim 6 wherein the second groove corner has an included angle of 270°, and the second plurality of metal structures extend diagonally in the interconnect structure relative to the second groove corner.

8. A structure comprising:

a photonics chip including a substrate and an interconnect structure over the substrate, the photonics chip having a first exterior corner, a second exterior corner, and a side edge extending from the first exterior corner to the second exterior corner, the substrate including a groove positioned along the side edge between the first exterior corner and the second exterior corner, the groove arranged to intersect the side edge at a groove corner, the interconnect structure including a first plurality of metal structures adjacent to the groove corner, and the first plurality of metal structures extending diagonally in the interconnect structure relative to the side edge, wherein the interconnect structure includes a guard ring, and the first plurality of metal structures are arranged at the groove corner adjacent to the guard ring.

9. The structure of claim 8 wherein the photonics chip includes a plurality of optical components and a plurality of electrical components, the interconnect structure includes a portion over the plurality of optical components and the plurality of electrical components, and the first plurality of metal structures are positioned between the groove corner and the portion of the interconnect structure.

10. The structure of claim 9 wherein the plurality of optical components include an edge coupler adjacent to the groove.

11. The structure of claim 8 wherein the guard ring includes a second plurality of metal structures, and the first plurality of metal structures are connected to different portions of the second plurality of metal structures.

12. The structure of claim 11 wherein the guard ring includes a first segment and a second segment that intersects the first segment at the groove corner, and the first plurality of metal structures extend diagonally from the second plurality of metal structures of the first segment of the guard ring to the second plurality of metal structures of the second segment of the guard ring.

13. The structure of claim 12 wherein the first plurality of metal structures intersect the second plurality of metal structures of the first segment of the guard ring at a first acute angle, and the first plurality of metal structures intersect the second plurality of metal structures of the second segment of the guard ring at a second acute angle.

14. The structure of claim 11 wherein the interconnect structure includes a plurality of metallization levels, the first plurality of metal structures are positioned in the plurality of metallization levels, and the second plurality of metal structures are positioned in the plurality of metallization levels.

15. The structure of claim 14 wherein the first plurality of metal structures and the second plurality of metal structures each include a plurality of plates and a plurality of vias positioned in the plurality of metallization levels.

16. The structure of claim 8 wherein the interconnect structure includes a crackstop rail, and the guard ring is positioned between the crackstop rail and the first plurality of metal structures.

* * * * *